United States Patent
Higgins et al.

(10) Patent No.: US 10,459,786 B2
(45) Date of Patent: Oct. 29, 2019

(54) SCALING LARGE DRIVES USING ENHANCED DRAM ECC

(71) Applicant: Western Digital Technologies, Inc., San Jose, CA (US)

(72) Inventors: James M. Higgins, Chandler, AZ (US); Rodney Brittner, San Jose, CA (US); Steven Sprouse, San Jose, CA (US); David George Dreyer, Rochester, MN (US); Mark D. Myran, Trabuco Canyon, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 234 days.

(21) Appl. No.: 15/633,848

(22) Filed: Jun. 27, 2017

(65) Prior Publication Data
US 2018/0373590 A1 Dec. 27, 2018

(51) Int. Cl.
*G06F 11/00* (2006.01)
*G06F 11/10* (2006.01)
*G06F 12/02* (2006.01)
*G06F 12/06* (2006.01)
*G11C 29/52* (2006.01)

(52) U.S. Cl.
CPC ...... *G06F 11/1068* (2013.01); *G06F 12/0238* (2013.01); *G06F 12/0638* (2013.01); *G06F 2212/205* (2013.01); *G06F 2212/7201* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 8,671,330 B2* | 3/2014 | Komagome | G06F 11/1016 714/768 |
| 2004/0186946 A1* | 9/2004 | Lee | G06F 3/0616 711/103 |
| 2006/0242212 A1* | 10/2006 | Brinkmann | G06F 3/0619 |
| 2018/0018100 A1* | 1/2018 | Aho | G06F 3/0608 |
| 2018/0173419 A1* | 6/2018 | Dubeyko | G06F 3/061 |

* cited by examiner

*Primary Examiner* — Daniel F. McMahon
(74) *Attorney, Agent, or Firm* — Patterson & Sheridan, LLP; Steven H. Versteeg

(57) ABSTRACT

The present disclosure generally relates to solid state storage device and techniques for conserving storage capacity associated therewith. Several embodiments are presented, including a data storage device, data storage controller, and methods for using the same are provided in the subject disclosure. A data storage device includes: a plurality of memory devices, a controller coupled to the plurality of memory devices and configured to program data to and read data from the plurality of memory devices, a memory including a logical-to-physical address translation map configured to enable the controller to determine a physical location of stored data in the plurality of memory devices, where the logical-to-physical address translation map contains at least one entry that merges at least two addresses that map, respectively, to at least two physical locations in the plurality of memory devices, where the controller is configured to encode each merged entry with an error-correcting code.

22 Claims, 5 Drawing Sheets

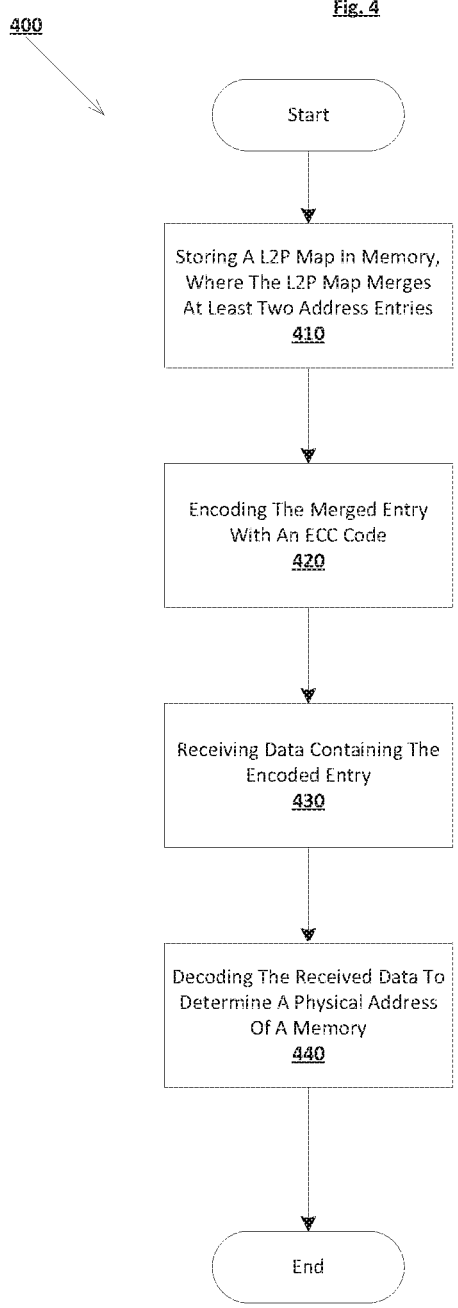

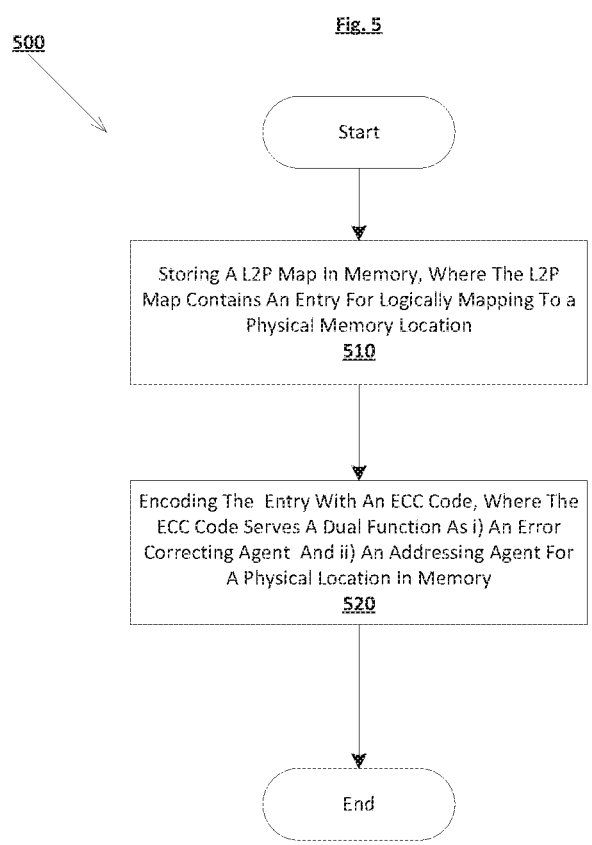

SCALING LARGE DRIVES USING ENHANCED DRAM ECC

BACKGROUND OF THE DISCLOSURE

Field of the Disclosure

Embodiments of the present disclosure generally relate to logical-to-physical mapping tables and error-correcting code techniques applied to Flash memory systems.

Description of the Related Art

Non-volatile memory systems, such as flash memory, have been widely adopted for use in consumer products. Flash memory may be found in different forms, for example in the form of a portable memory card that can be carried between host devices or as a solid state disk or solid state storage (SSD) embedded in a host device. Given the widespread use of Flash memory devices, techniques to conserve memory storage in Flash memory systems, while preserving necessary functionalities, including the memory of peripheral and controller devices associated therewith, are always in need.

SUMMARY OF THE DISCLOSURE

The present disclosure generally relates to solid state storage device and techniques for conserving storage capacity associated therewith. Several embodiments are presented, including a data storage device, data storage controller, and methods for using the same are provided in the subject disclosure. A data storage device includes: a plurality of memory devices, a controller coupled to the plurality of memory devices and configured to program data to and read data from the plurality of memory devices, a memory including a logical-to-physical address translation map configured to enable the controller to determine a physical location of stored data in the plurality of memory devices, where the logical-to-physical address translation map contains at least one entry that merges at least two addresses that map, respectively, to at least two physical locations in the plurality of memory devices, where the controller is configured to encode each merged entry with an error-correcting code.

In one embodiment, a data storage device is provided. The data storage device includes: a plurality of memory devices, a controller coupled to the plurality of memory devices and configured to program data to and read data from the plurality of memory devices, a memory including a logical-to-physical address translation map configured to enable the controller to determine a physical location of stored data in the plurality of memory devices, where the logical-to-physical address translation map contains at least one entry that merges at least two addresses that map, respectively, to at least two physical locations in the plurality of memory devices, where the controller is configured to encode each merged entry with an error-correcting code.

In another embodiment, a data storage device controller is provided. The controller includes: a processor configured to couple to a memory and to a plurality of memory devices, each of the plurality of memory devices being configured to store data at a predetermined physical location within the plurality of devices, where the processor is further configured to program data to and read data from the plurality of memory devices, the memory containing a logical-to-physical address translation map configured to enable the processor to determine a physical location of data stored in the predetermined physical location, and where the processor simultaneously encodes at least two entries of the logical-to-physical address translation map with a single error-correcting word.

In another embodiment, a logical-to-physical address translation map useable in a data storage device is provided. The map includes: a plurality of entries that map a logical address to a physical location of stored data in a plurality of memory devices, where at least one entry of the plurality of entries merges at least two addresses that map, respectively, to at least two physical locations in the plurality of memory devices, and where the at least one entry is configured to receive an encoding operation by a controller coupled to the plurality of memory devices.

In another embodiment, a method of controlling a data storage device that includes a volatile memory and a plurality of non-volatile memory devices is provided. The method includes: storing, in a volatile memory, a logical-to-physical address translation map that contains at least one entry that merges at least two addresses that map, respectively, to at least two physical locations of a plurality of memory devices, and encoding the at least one entry with an error correcting code with a memory controller.

In another embodiment, a method of controlling a data storage device including a memory and a plurality of non-volatile memory devices is provided. The method includes: storing, in a volatile memory, a logical-to-physical address translation map that contains at least one entry to a physical location of a plurality of memory devices, and encoding the at least one entry with an error correcting code with a memory controller, where at least one bit of the error correcting code is configured by the memory controller to operate as an address data, in the at least one entry, of the physical location of a plurality of memory devices.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is a flow diagram of an example method for improving the storage capacity of memory devices associated with a memory controller using error correcting code techniques in accordance with an embodiment of the present disclosure.

FIG. 5 is a flow diagram of an example method for improving the storage capacity of memory devices associated with a memory controller using error correcting code techniques in accordance with an embodiment of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to solid state storage device and techniques for conserving storage capacity associated therewith. Several embodiments are presented, including a data storage device, data storage controller, and methods for using the same are provided in the subject disclosure. A data storage device includes: a plurality of memory devices, a controller coupled to the plurality of memory devices and configured to program data to and read data from the plurality of memory devices, a memory including a logical-to-physical address translation map configured to enable the controller to determine a physical location of stored data in the plurality of memory devices, where the logical-to-physical address translation map contains at least one entry that merges at least two addresses that map, respectively, to at least two physical locations in the plurality of memory devices, where the controller is configured to encode each merged entry with an error-correcting code.

Methods for improving the storage capacity, while preserving error correcting capabilities, of a data storage device i) using error correcting capabilities of an error correction code (ECC) and ii) adjusting the configuration of a logical-to-physical mapping table are described herein. Generally, a logical-to-physical mapping table may include entries with an ECC code therein, where the ECC code serves both an error correction functionality and an address identification functionality. Additionally, in certain embodiments, the logical-to-physical mapping table merges at least two address entries with a single ECC word to increase storage capacity while preserving error-correcting capabilities.

Figure 1:
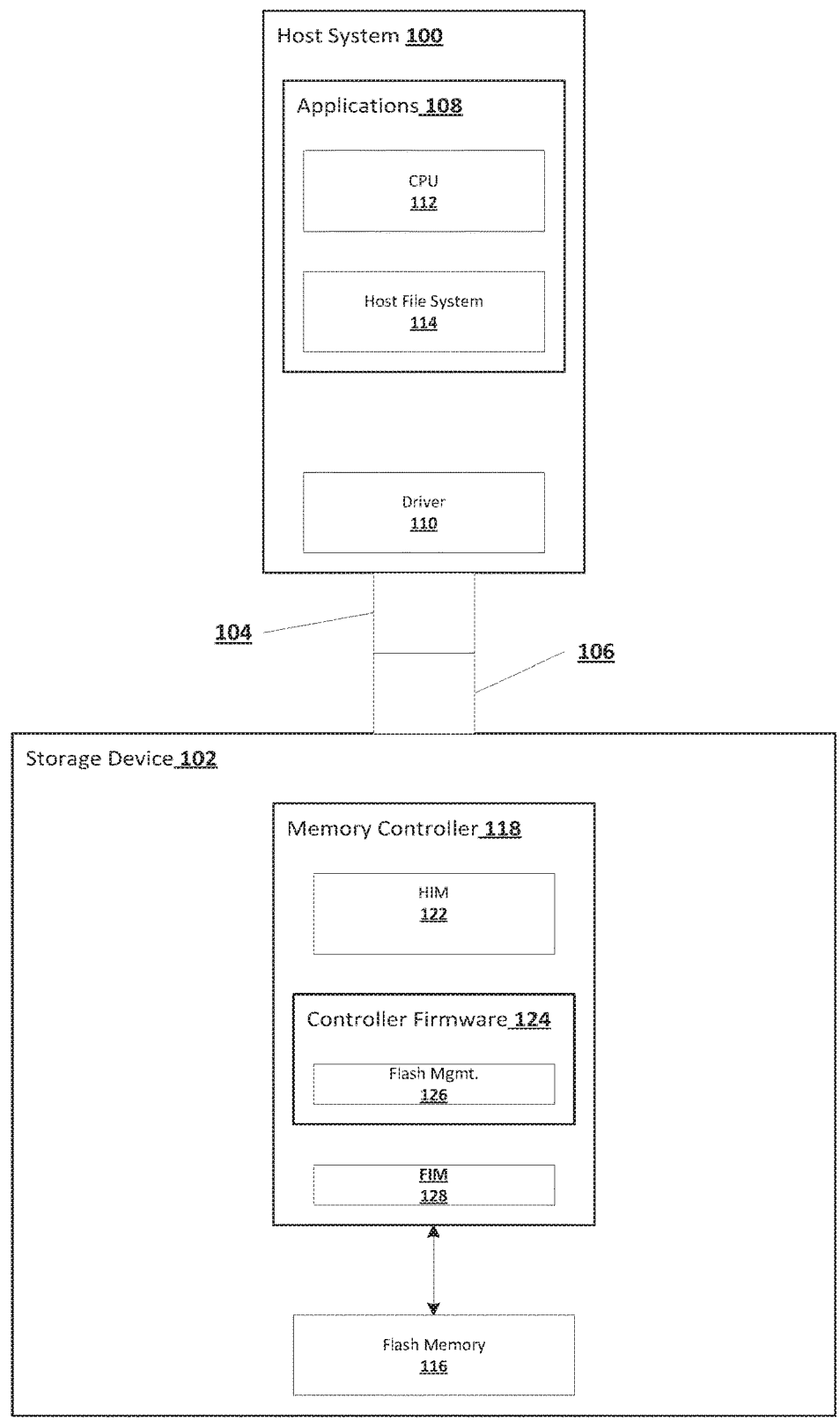
FIG. 1 is a block diagram of a host connected with a memory system having non-volatile memory in accordance with at least one embodiment.

A host system 100 of FIG. 1 stores data into and retrieves data from a memory system 102. The memory system 102 may be embedded within the host, such as in the form of a solid state disk (SSD) drive installed in a personal computer. Alternatively, the memory system 102 may be in the form of a flash memory card that is removably connected to the host through mating parts 104 and 106 of a mechanical and electrical connector as illustrated in FIG. 1. A memory system 102 configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory system 102 is concerned, made up of a combination of circuitry and software. An applications portion 108 may interface with the memory system 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a memory controller 118 that both interfaces with the host 100 to which the memory system 102 is connected for passing data back and forth and controls or communicates with the memory 116. The memory controller 118 may be implemented on a single integrated circuit chip, such as an application specific integrated circuit (ASIC). The memory controller 118 may include a multi-thread processor capable of communicating via a memory interface 128 having I/O ports for each memory bank in the flash memory 116. The memory controller 118 may include an internal clock. The processor of the memory controller 118 may communicate with an error correction code (ECC) module, a RAM buffer, and a boot code ROM via an internal data bus.

The memory controller 118 may convert between logical addresses of data used by the host 100 and physical addresses of the flash memory 116 during data programming and reading. Functionally, the memory controller 118 may include a Host interface module (HIM) 122 that interfaces with the host system controller logic 110, and controller firmware module 124 for coordinating with the host interface module 122, and flash interface module (FIM) 128. Flash management logic 126 may be part of the controller firmware 124 for internal memory management operations such as garbage collection. One or more flash interface modules (FIMs) 128 may provide a communication interface between the controller and the flash memory 116.

A flash transformation layer ("FTL") or media management layer ("MML") may be integrated in the flash management 126 and may handle flash errors and interfacing with the host. In particular, flash management 126 is part of controller firmware 124 and FTL may be a module in flash management. The FTL may be responsible for the internals of NAND management. In particular, the FTL may be an algorithm in the memory device firmware which translates writes from the host 100 into writes to the flash memory 116. The FTL may include a the logical block address ("LBA") map, i.e. a logical-to-physical mapping table "L2P table," that translates addresses for the flash memory. An FTL algorithm may provide logical to physical address mapping which includes an algorithm to convert logical addresses from the file system to physical addresses of flash memory. In one embodiment, the L2P table is a global address table or "GAT," which may have an entry for each logical group. In particular, a GAT page may include mapping of the logical to the physical address translation for each logical group.

The logical-to-physical mapping table stems from the nature of flash memory in solid state drives (SSDs), i.e. data is typically programmed by pages and erased by blocks. A particular physical location in an SSD (e.g., a page) cannot be directly overwritten without overwriting data in pages within the same block, as is possible in a magnetic hard disk drive. As such, address indirection is needed. This is why it is advantageous for a device controller, such as the memory controller 118, to use a L2P mapping as part of the Flash Translation Layer (FTL). When new data comes in replacing older data already written, the data storage device controller causes the new data to be written in a new location (as the data storage device cannot directly overwrite the old data) and update the logical mapping to point to the new physical location. At this juncture, the old physical location no longer holds valid data. As such, the old physical location will eventually need to be erased before it can be written again.

In some embodiments, a large L2P map table maps logical entries to physical address locations on an SSD. This large L2P map table is usually saved in small sections as writes come in. For example, if random writing occurs, although the system may have to update only one entry, it may nonetheless have to save the entire table or a portion thereof, including entries that have not been updated, which is inherently inefficient.

A Logical Block Addressing (LBA) scheme for data storage devices can contain one entry for every logical block defined for the data storage device's Flash memory. For example, a 64 GB data storage device that supports 512 byte logical blocks may present itself to the host as having 125,000,000 logical blocks. One entry in the map table contains the current location of each of the 125,000 logical blocks in a Flash memory. In a conventional data storage device, a Flash page holds an integer number of logical blocks (i.e., a logical block does not span across Flash pages). In this conventional example, an 8 KB Flash page would hold 16 logical blocks (of size 512 bytes). Therefore, each entry in the logical-to-physical map table can contain a field or address for identifying a location of physical memory. The address can contain a field for identifying the die on which the LBA is stored, a field for identifying the flash block on which the LBA is stored, another field for identifying the flash page within the flash block, and/or a field identifying the offset within the flash page that identifies where the LBA data begins in the identified Flash page. The large size of the map table prevents the table from being held inside the SSD controller. The large map table is held in an external memory, such as a DRAM (volatile) or ReRAM (non-volatile), connected to the SSD memory controller, such as memory controller 118.

In one embodiment, the flash memory 116 may be considered to include multi-level cell (MLC) or single level cell (SLC) memory. The memory may be included as part of the memory controller 118 rather than as part of the flash memory 116 in some embodiments. The flash memory 116 may be mostly MLC, while binary cache and update blocks may be SLC memory. Update blocks may be SLC memory with page based addressing or page based Logical Group (LG) organization. The LG size for the GAT may depend on the data. For example, sequential data may be indexed with a large LG size, while fragmented data may be indexed with a smaller LG size. In particular, the GAT may default to a large LG size, but reference additional GAT pages for fragmented data, where the additional GAT pages include a smaller LG size. The LG size for the GAT and additional GAT pages may occur at the FTL or flash management 126 of the controller 118.

Figure 2:
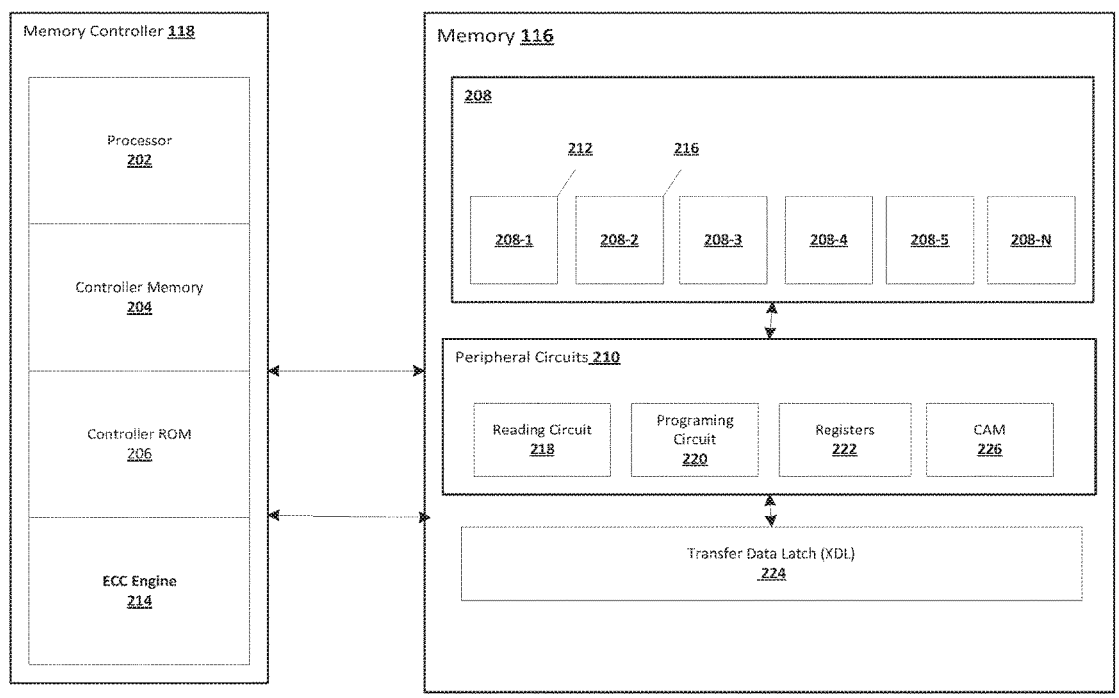
FIG. 2 is a block diagram illustrating more details of certain elements shown in FIG. 1.

Referring to FIG. 2, by way of example and without limitation, in an embodiment, memory controller 118 includes a processor 202, controller memory 204, controller ROM 206 and error correcting code (ECC) engine 214, where the ECC engine 214 is configured to operate as discussed below. Controller memory 204 can be volatile, including but not limited to DRAM, or non-volatile, including but not limited to ReRAM. Furthermore, although controller memory 204 is shown as being part of memory controller 118, it can be located in a physically distinct area, i.e. as a DRAM storage unit that communicates with the processor 202 and EEC engine 214 via an appropriate medium of communication. In certain embodiments, the controller memory 204 contains the L2P table that the memory control will use to logically address the physical memory in memory 116. The processor 202 may include a microprocessor, a microcontroller, an application specific integrated circuit (ASIC), a field programmable gate array, a logical digital circuit, or other now known or later developed logical processing capability. Controller ROM 206 may store software instructions that processor 202 may execute to control the operation of storage device 102. Controller ROM 206 may also include software instructions that when executed by processor 202 effectuate the verification of data corresponding to configuration parameters and the recovery of corrupt data corresponding to configuration parameters stored in memory 116. Controller ROM 206 may be used to store instructions corresponding to the basic input output system (BIOS). The instructions of the BIOS when executed by processor 202 may cause the initialization and testing of the memory system 200 components and cause the processor 202 to search for and load a boot code or an operating system stored in memory 116. Examples of controller ROM 206 include electrically erasable programmable read only memory (EEPROM), NOR flash memory etc. A characteristic of controller ROM 204 is that it can be read and written on a byte by byte or word by word basis.

In one embodiment, memory 108 includes non-volatile memory 208, peripheral circuits 210 and a transfer data latch 224. The non-volatile memory 208 includes NAND flash memory. In this embodiment, non-volatile memory 208 is organized as N memory blocks 208-1 to 208-N. A memory block is organized as a set of memory pages or simply pages, memory page 212 for example. A page is a smallest unit of writing in the memory 208 and a memory block is the smallest unit of erasing. Thus, data is typically programmed or stored on a page by page basis. However, erasing data programmed in a page requires erasure of all the pages in the memory block. Data received from the host system 100 is typically programmed or stored in an erased memory page.

Peripheral circuits 210 may also include electronic componentry such as analog to digital convertors (ADC), digital to analog convertors (DAC), charge pumps, amplifiers, level shifters etc. By way of example and without limitation, in an embodiment, the electronic componentry may be functionally and logically categorized as programming circuit 220, reading circuit 218, registers 222 and content addressable memory (CAM) 226. In an embodiment, the memory controller 118 may read data corresponding to pre-programmed configuration data stored in controller ROM 206, for example and instruct ECC engine 214 to compute an ECC for the read data; for example, as discussed below, an ECC code word for a merged entry in a logical to physical mapping table. Memory controller 118 may store the computed ECC with the pre-programmed configuration data in a memory page, memory page 212 for example. Separately, memory controller 118 may program a flag in CAM 226 indicating that the pre-programmed configuration data have been stored with an ECC. The CAM 226 may also include the address of the memory page where the configuration parameters and the ECC are stored.

In an embodiment, peripheral circuit 210 further includes programming circuit 220, reading circuit 218, erasing circuit 222 and transfer data latch (XDL) 224. The XDL 224 functions as intermediate data storage between memory controller 118 and memory. When instructed by host system 100 to write data to memory, memory controller 118 writes data to XDL 224. The programming circuit 220 then writes the data from XDL 224 to the specified memory block and page. In an embodiment, the programming circuit 220 translates the binary representation of data received from host system 100 into programming voltages and periods. The programming circuit applies these programming voltages for the programming periods to memory cells to cause the memory cells to store electric charge. The amount of stored electric charge is representative of the binary representation of the received data.

Similarly, when instructed to read data from a specified memory page, reading circuit 218 reads data from the specified memory page into the XDL 224 and memory controller 118 transfers the read data from the XDL 224 to controller memory 204, which can be a DRAM memory. In an embodiment, the reading circuit 218 of FIG. 2 translates the amount of charge stored in a memory cell to a binary representation of the data corresponding to the amount of charge stored in the cell. By way of example and without limitation, the reading circuit 218 may include current to voltage convertors, amplifiers and analog to digital convertors.

In an embodiment, the memory controller 118 maintains a copy of the logical to physical address table in controller memory 204. An entry in the table includes a reference to a memory page. Thus, the logical to physical address table may include an array of references to memory pages. One format of an entry in the table may include a reference to the memory block associated with the memory page and an index of the memory page in the memory block. As an example, a reference to memory page 212 may include a reference to memory block 208-1 and the index of memory page 212 in memory block 208-1.

The host system 100 when requesting a write of data to a memory page specifies a logical block address (LBA). In response to receiving a request from host system 100 to write data to a logical address, processor 202 may identify an erased memory page. In an exemplary embodiment, processor 202 may identify an erased memory page in an SLC memory block, memory page 212 for example. Processor 202 may instruct ECC engine 214 to compute an ECC for the data. Processor 202 may write the data and the ECC to XDL 224 and may instruct the programming circuits 220 to store the data and the computed ECC in the identified SLC memory page. Furthermore, processor 202 may utilize the LBA received with the request to write data as an index to an entry in the logical to physical address table corresponding to LBA. If the entry includes a reference to a memory page, processor 202 may mark the memory page as containing obsolete data. Processor 202 may update the entry with a reference to the SLC memory page to which data was stored.

The ECC engine 214 can include one or modules to perform the ECC functions discussed herein. For example, it can include an error detection code (EDC) module (not shown) (e.g., an ECC encoder/decoder), and an error correction code (ECC) module (not shown) (e.g., an ECC encoder/decoder). The EDC module can generate an error detection code based on inputted data, and the ECC module can generate an error correction code based on inputted data. In an embodiment, the memory controller 118 is configured to correct errors using an ECC code (e.g., part of the memory controller 118 is an ECC correction engine). Data as used in this context can include the normal data page to be stored or retrieved as well as header, metadata, or spare fields used to store addresses, flags or data computed by either the host system 100 or the controller 118. Whereas an error detection code allows at least one error to be detected but not corrected, an error correction code allows at least one error to be both detected and corrected. The number of errors that can be detected and/or corrected depends on the type of error detection code scheme and error correction code scheme that are used. Suitable types of error correction code schemes include, but are not limited to, Hamming code and Reed-Solomon code.

Figure 3A:
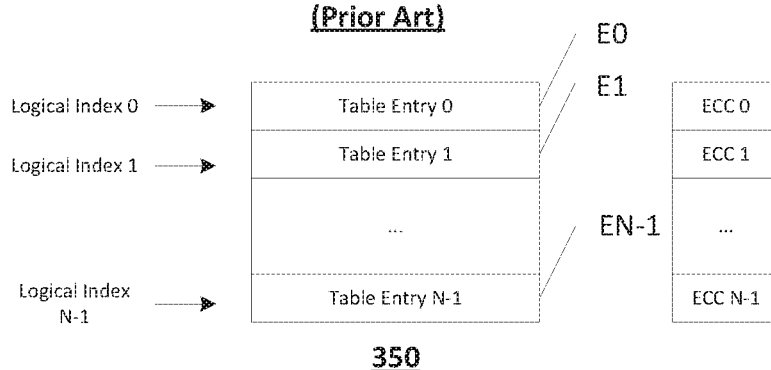
FIG. 3A is a simplified diagram illustrating a logical-to-physical mapping table as known in the prior art.

FIG. 3A illustrates a conventional L2P table 350, where an ECC engine encodes each entry with a distinct ECC code word. In the case where each entry of the table, i.e. E0-EN-1, includes 32 bits of data, i.e. address information corresponding to a physical memory location in flash memory 116, the ECC engine would encode each entry with an 8 bit ECC code, for a total of 40 bits of usage. In the event the memory controller had to retrieve information associated with the encoded entry, the ECC engine would decode the entry to obtain the relevant information from the single entry, i.e. E0, and the decoded information could be transmitted accordingly by the memory controller 118. The conventional L2P and error correcting code scheme, the ECC engine does not contain address information for a physical location of memory, i.e. it does not serve a dual purpose, and the L2P table does not have merged address entries that are encoded with the same ECC word.

Figure 3B:
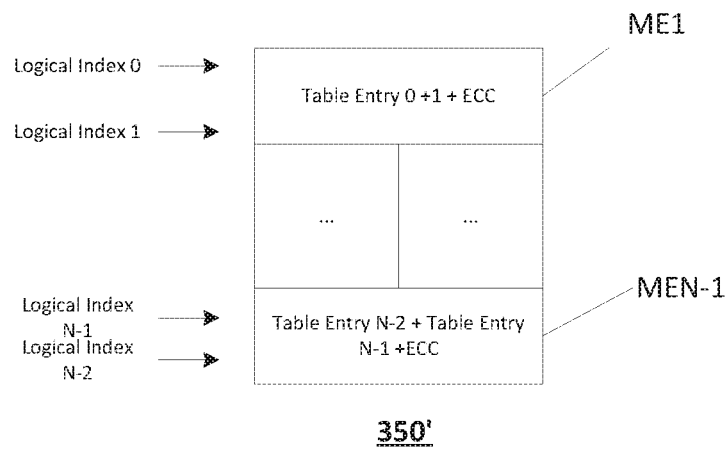
FIG. 3B is a simplified diagram illustrating a logical-to-physical mapping table in accordance with at least one embodiment of the present disclosure.

FIG. 3B illustrates one embodiment of a ECC application and L2P table in accordance with the present disclosure. The L2P table is located in memory 204 and can be accessed by the ECC engine 214 therefrom. ECC engine 214 will use the same ECC code word to encode at least one merged entry in the mapping table 350'. The memory controller 118 will merge the information, i.e. addresses, of two entries into a single entry, and the ECC engine 214 will encode each entry using a single error correcting code. In one embodiment, as shown in FIG. 3B, the memory controller 118 will be configured to have a pointer or logical index that points to each address associated with an entry, and as such, when an entry is merged, two or more logical indexes can point (or identify) to a merged entry. The ECC engine 214 can employ any suitable single-bit error correction, dual-bit error detection, scheme ("SECDED") to achieve this result, including but not limited to a Hamming code technique. In one embodiment, the L2P table configuration and instructions for establishing a communication with ECC engine 214 can be included in memory controller ROM 206. When the memory controller 118 has to read and subsequently decode the encoded entry, although the ECC engine 214 will still decode the two or more addresses of the merged entry, the memory controller 118 can still determine a relevant single address or information from the merged addresses because of the nature of odd/even parity in a SECDED bit word and because the memory controller 118 will be configured to determine the particular length of each bit word. In one embodiment, since, for example, a Hamming encoding/decoding operation inherently uses bit length to compute parity bits, and since the length of the ECC word will be determined, the memory controller 118, during a decode operation, can determine what portion of a merged entry corresponds to one or more actual addresses of the merged entry.

In an embodiment of the present disclosure, to remedy latency associated with any complexities that may arise in configuring the ECC engine 214 of the memory controller 118 to have the above described functionalities, the memory controller 118 will pair the bit transfer rate of the ECC engine 214 to the size of the address of a single entry, i.e. if the size of a single entry, prior to merging, is 32 bits, then the transfer rate will be set to 32 bytes. In another embodiment, the memory 204 can be non-volatile ReRam, which by its nature, further enhances the transfer rate and avoids latency due to higher read/write speeds.

In an embodiment of the present disclosure, certain bits of the error correcting code can contain address information for the merged entry, i.e. the error correcting code has a dual function of detecting/correcting errors in the address of the relevant entry, but additionally, at least one of the error correcting code bits can operate also as an address bit(s) for the relevant entry. The memory controller 118, by having the ECC engine 214 apply a particular parity for a set of bits, and by doing at least one of the following i) determining the parity applied by the ECC engine 214, ii) determining size of the encoded address, and/or iii) determining the odd/even status of the next entry in the table, the memory controller 118 can use a relevant ECC bit as part of the one or more addresses of the merged entry.

The above embodiments increase the storage capacity associated with the memory controller 118, i.e. memory 204, by conserving storage in using a single ECC code word for at least two address entries. In the scenario where 32 bits of address information and 8 bits of ECC code are used for a single entry, merging the entries and using a single ECC code leads to 36 bits of address information. Other embodiments, in accordance with the principles discussed herein and below, contemplate benefits when an unmerged entry is at least 32 bits and the encoded entry is 33 bits. In this embodiment, a portion of the ECC code word is configured by the memory controller 118 to also contain addressing information for the relevant entry. Therefore, in a specific embodiment of the present disclosure, the memory controller 118 would merge the address information of at least two entries in an L2P table as shown in FIG. 3B, where a single entry, prior to merging it with another entry, constitutes 32 bits of user space, i.e. address information for a physical location of memory, and, where prior to merging, a single entry is paired up with 8 bits of DDR ECC, allowing the memory controller 118 (in this embodiment a DRAM controller) to correct any 1 bit in error within an entry and detect 2 bits in error (SECDED). In total, prior to the merging of at least two entries and encoding this uses 40 bits of DRAM storage while providing 32 bits of space per entry. However, by combining two entries together for ECC, we can provide this SECDED level of safety with only 8 bits for ECC, allowing space for 36-bit table entries. This is the difference between addressing 16 TB of flash and addressing 256 TB of flash (at 4-KB granularity). Furthermore, in one embodiment, in order to avoid or reduce latency, the memory 204 is of a DRAM type and the memory controller 118 operates at 32 byte MBURST level to mitigate latency costs that are associated with multiple encodings and decoding that occur to perform a read or write type operations for the entries that have merged addresses.

The benefits of merging more than one entry increase by scale, and as such, embodiments of the present disclosure can range from merging at least two table entries in a L2P table and up to including 8 entries. Furthermore, the scheme can also apply when the unmerged entries are larger, i.e. instead of 32 bits, the entries can be 64 bits, etc.

Figure 3C:
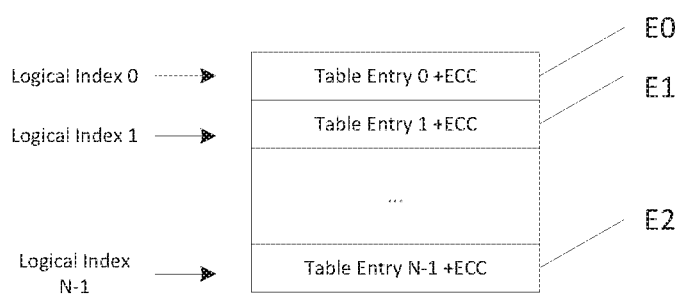
FIG. 3C is a simplified diagram illustrating a logical-to-physical mapping table in accordance with at least one embodiment of the present disclosure.

FIG. 3C illustrates another embodiment of the present disclosure. The ECC engine 214 will encode a single entry of a L2P table 360, i.e. E0, E1, etc. with an error correcting code such that the error correcting code, not only operates in a traditional fashion for detecting and correcting errors, but also such that the error correcting code contains address information for the physical location of memory associated with that entry. In one embodiment, this is accomplished for an odd number of bits, i.e. 33 bit entry, constituting the address information for an entry, i.e. E0, with the error correcting code also being odd, i.e. 7 bits. In this embodiment of the present disclosure, one of the error correcting code bits can be used by the memory controller 118 to operate as part of the address of the relevant entry, i.e. the error correcting code bit has a dual function of detecting/correcting errors in the address of the relevant entry, but additionally, at least one of the error correcting code bits can also operate as an address bit(s) for the relevant entry. The memory controller 118, by having the ECC engine 214 apply a particular parity for a set of bits, and determining that parity applied by the ECC engine 214, determining the size of the encoded address, and by determining the status of the next entry in the table, the memory controller can use a relevant ECC bit as part of the address information of the single entry. In one embodiment, by configuring the error correcting code word to be 7 bits, instead of 8 bits, and configuring the entries in the L2P table to contain 33 bits of address information, the storage capacity for actual addressing information can be doubled. Furthermore, in one embodiment, memory 204, which stores L2P table 360, is of a DRAM type.

FIG. 4 is a flow diagram of an exemplary method 400 that may be implemented to verify, authenticate and correct data corresponding to previously described configuration parameters. Method 400 may be implemented by memory system 200. Functionality ascribed to the various steps of method 400 may be implemented by software instructions or hardware componentry or any combination thereof. In one embodiment, method 400 may be implemented as software instructions and stored in controller ROM 206. The software instructions may be executed by processor 202 to effectuate the method steps of controlling a data storage, while conserving storage space and applying error correction techniques.

At step 410, a logical-to-physical address translation map, such as one illustrated in FIG. 3B, is stored, by the memory controller 118 or preconfigured/programmed by a user, in ROM 206 or equivalent memory unit. The logical-to-physical translation map is configured so that at least two logical addresses associated with physical memory, i.e. locations of memory 116, are merged in at least one entry of map 350'. This can be accomplished by having the table pre-configured as such and stored in ROM 206, alternatively the memory controller 118 can merge two entries of an existing table, i.e. 350, to develop a table 350'. At step 420, the ECC engine 214 encodes the merged entries with a same error correcting code.

According to one embodiment, at step 430, the memory controller 118 receives the encoded version of the data encoded in step 420. This can happen as a result of the memory controller 118 having to perform a read operation on the physical location of memory 116, which in turn requires reading a the logical address (now encoded) associated with that physical location 116. At step 440, the memory controller 118 decodes the encoded data. Furthermore, in one embodiment, the memory 204, which stores L2P table 360, is of a DRAM type.

In one embodiment, the encoding and decoding are performed by the ECC engine 214 in accordance with a SECDED scheme; and as stated above, in one embodiment, Hamming encoding/decoding operation are performed. Since Hamming techniques inherently use bit length to compute parity bits, and since the length of the ECC word is determinable, the memory controller 118, during a decode operation, can determine what portion of a merged entry corresponds to one or more actual addresses of the merged entry. Accordingly, in one embodiment, per a step not shown in FIG. 4, in order to perform the decoding step, the memory controller 118 can be configured to determine or detect the size of the error correcting code word used by the ECC engine 214, and the memory controller can be configured to determine a i) bit size and ii) parity format of the error correcting code, which in turn permits the ECC code to not only decode a merged entry, but identify which portion corresponds to which of the two or more encoded addresses. In one embodiment, the memory controller can also determine which decoded address of the merged entry corresponds to which portion of physical memory in memory 116 by being configured, or preconfigured, with the offset or increment difference between addresses.

In one embodiment, the method 400 can be employed where 32 bits of address information and 8 bits of ECC code are used for a single entry, and merging the entries and using a single ECC code leads to 36 bits of address information. As stated above, other embodiments, in accordance with the principles discussed herein and below, contemplate benefits when an unmerged entry is at least 32 bits and the encoded entry is 33 bits. Therefore, as discussed above, in a specific embodiment of the present disclosure, the memory controller 118 would merge the address information of at least two entries in an L2P table as shown in FIG. 3B, where a single entry, prior to merging it with another entry, constitutes 32 bits of user space, i.e. address information for a physical location of memory, and, where prior to merging, a single entry is paired up with 8 bits of DDR ECC, allowing the DRAM controller to correct any 1 bit in error within an entry and detect 2 bits in error (SECDED). In total, prior to the merging of at least two entries and encoding this uses 40 bits of DRAM storage while providing 32 bits of space per entry. However, by combining two entries together for ECC, we can provide this SECDED level of safety with only 8 bits for ECC, allowing space for 36-bit table entries. This is the difference between addressing 16 TB of flash and addressing 256 TB of flash (at 4-KB granularity). Furthermore, in one embodiment, in order to avoid or reduce latency, the memory 204 is of a DRAM type and the memory controller 118 operates at 32 byte MBURST level to mitigate latency costs that are associated with multiple encodings and decoding that occur to perform a read or write type operations for the entries that have merged addresses.

FIG. 5 is a flow diagram of an exemplary method 500 that may be implemented to verify, authenticate and correct data corresponding to previously described configuration parameters. Method 500 may be implemented by memory system 200. Functionality ascribed to the various steps of method 500 may be implemented by software instructions or hardware componentry or any combination thereof. In one embodiment, method 500 may be implemented as software instructions and stored in controller ROM 206. The software instructions may be executed by processor 202 to effectuate the method steps of controlling, while conserving storage space and applying error correction techniques.

At step 510, a logical-to-physical address translation map, such as one illustrated in FIG. 3C, is stored, by the memory controller 118 or preconfigured/programmed by a user, in ROM 206 or equivalent memory unit. Each entry of the logical-to-physical address translation map contains an entry that maps a physical location of memory in memory 116 to address information contained in the table entry. In step 520, as discussed above, The ECC engine 214 will encode a single entry of a L2P table 360, i.e. E0, E1, etc. with an error correcting code such that the error correcting code, not only operates in a traditional fashion for detecting and correcting errors, but also such that the error correcting code contains address information for the physical location of memory associated with that entry. In one embodiment, this is accomplished for an odd number of bits, i.e. 33 bit entry, constituting the address information for an entry, i.e. E0, with the error correcting code also being odd, i.e. 7 bits. In this embodiment of the present disclosure, one of the error correcting code bits can be used by the memory controller 118 to operate as part of the address of the relevant entry, i.e. the error correcting code bit has a dual function of detecting/correcting errors in the address of the relevant entry, but additionally, at least one of the error correcting code bits can also operate as an address bit(s) for the relevant entry. The memory controller 118, by having the ECC engine 214 apply a particular parity for a set of bits, and determining that parity applied by the ECC engine 214, determining the size of the encoded address, and by determining the status of the next entry in the table, the memory controller can use a relevant ECC bit as part of the address information of the single entry. In one embodiment, by configuring the error correcting code word to be 7 bits, instead of 8 bits, and configuring the entries in the L2P table to contain 33 bits of address information, the storage capacity for actual addressing information can be doubled. Furthermore, in one embodiment the memory 204, which stores L2P table 360, is of a DRAM type. In another embodiment, to further reduce cost and increase persistency, the memory 204, is of a ReRAM Type.

Certain embodiments of the present disclosure provide the ability to conserve storage, while preserving error correcting functionality, by i) using ECC code, in addition to performing an error correcting/detecting operation, as a carrier of address data and/or ii) merging table entries in a logical-to-physical mapping table and encoding the merged entry with the same ECC code word. This provides economic and technical benefits at least by increasing storage space in memory devices, in addition to preserving error detecting and correcting functionality.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a plurality of memory devices;
   a controller coupled to the plurality of memory devices and configured to program data to and read data from the plurality of memory devices; and
   a memory comprising a logical-to-physical address translation map configured to enable the controller to determine a physical location of stored data in the plurality of memory devices,
      wherein the logical-to-physical address translation map contains at least one entry that merges at least two addresses that map to at least two physical locations in the plurality of memory devices, wherein each of the at least two addresses map to one of the at least two physical locations, and
      wherein the controller is configured to encode the at least one entry with an error-correcting code, wherein the error-correcting code is configured to operate as address data of the at least two physical locations.

2. The data storage device according to claim 1, wherein the at least one entry merges between two addresses and eight addresses that map to at least two physical locations to at least eight physical locations in the plurality of memory devices.

3. The data storage device according to claim 1, wherein the memory is a volatile memory.

4. The data storage device according to claim 1, wherein the memory is non-volatile memory.

5. The data storage device according to claim 3, wherein the memory is DRAM.

6. The data storage device according to claim 4, wherein the memory is ReRAM.

7. The data storage device according to claim 5, wherein the controller is configured to transmit additional data at a rate based on a data size of a single address of the at least two physical locations.

8. The data storage device according to claim 7, wherein the at least one entry includes at least 33 bits in address data.

9. A data storage device controller, comprising:
   a processor coupled to a memory and to a plurality of memory devices, each of the plurality of memory devices being configured to store data at a predetermined physical location within the plurality of devices,
   wherein the processor is further configured to program data to and read data from the plurality of memory devices, the memory containing a logical-to-physical address translation map configured to enable the processor to determine a physical location of data stored in the predetermined physical location, and
   wherein the processor simultaneously encodes at least two entries of the logical-to-physical address translation map with a single error-correcting word, wherein the error-correcting word is configured to operate as address data of the at least two entries.

10. The data storage device according to claim 9, wherein the processor is further configured to decode additional data containing an address of one of the at least two entries of the logical-to-physical address translation map.

11. The data storage device according to claim 10, wherein the decoding operation detects between one and two bits in error for the data containing the address.

12. The data storage device according to claim 11, wherein the decoding operation corrects one bit in error of the data containing the address of one of the at least two entries of the logical-to-physical address translation map.

13. A a data storage device, comprising:
   a logical to physical address translation map;
   a plurality of entries that map a logical address to a physical location of stored data in a plurality of memory devices,
   wherein at least one entry of the plurality of entries merges at least two addresses that map to at least two physical locations in the plurality of memory devices,
   wherein the at least one entry is configured to receive an encoding operation by a controller coupled to the plurality of memory devices, and
   wherein the encoding operation encodes the at least one entry with an error-correcting code, wherein the error-correcting code is configured to operate as address data of the at least two physical locations.

14. The data storage device according to claim 13, further comprising:
   a plurality of logical indexes pointing to each of a plurality of addresses in the logical-to-physical address translation map, wherein at least two of the plurality of logical indexes point to the at least one entry.

15. A method of controlling a data storage device comprising a volatile memory and a plurality of non-volatile memory devices comprising:
   storing, in a volatile memory, a logical-to-physical address translation map that contains at least one entry that merges at least two addresses that map, to at least two physical locations of a plurality of memory devices; and
   encoding the at least one entry with an error correcting code with a memory controller, wherein the error-correcting code is configured to operate as address data of the at least two physical locations.

16. The method according to claim 15, further comprising:
   receiving, at the memory controller, data containing the at least one entry; and
   decoding, by the memory controller, data contained in the at least one entry in order to determine at least one of the at least two physical locations of a plurality of memory devices.

17. The method according to claim 16, wherein the decoding step further comprising:
   configuring the memory controller to determine a bit-size of one of the at least two addresses; and
   configuring the memory controller to determine a i) bit size and ii) parity format of the error correcting code, wherein the decoding step is based on the configuring steps.

18. The method according to claim 15, wherein, prior to merging, the at least two addresses of the at least one entry had a size of 32 bits, and wherein the at least one entry has a size of 33 bits.

19. The method according to claim 18, wherein the error-correcting code is 8-bits in size.

20. A method of controlling a data storage device comprising a memory and a plurality of non-volatile memory devices comprising:
   storing, in a volatile memory, a logical-to-physical address translation map that contains at least one entry to a physical location of a plurality of memory devices; and
   encoding the at least one entry with an error correcting code with a memory controller,
   wherein at least one bit of the error correcting code is configured by the memory controller to operate as address data, in the at least one entry, of the physical location of a plurality of memory devices.

21. A data storage device comprising a memory and a plurality of non-volatile memory devices:
   means for configuring, in a volatile memory, a logical-to-physical address translation map that contains at least one entry to a physical location of a plurality of memory devices; and
   means for encoding the at least one entry with an error correcting code,
   wherein at least one bit of the error correcting code is configured by the configuring means to operate as address data, in the at least one entry, of the physical location of a plurality of memory devices.

22. The data storage device according to claim 21, further comprising:
   means for merging i) the at least one entry and ii) another entry pointing to another physical location of the plurality of memory devices into a single entry in the logical-to-physical address translation map,
   wherein the encoding means encode the merged entry with the error correcting code,
   wherein the merged entry contains address data for the physical location and the another physical location of the plurality of memory devices, and
   wherein the error correcting code is a single error correcting code word.

* * * * *